United States Patent
Östman et al.

[19]

[11] Patent Number: 6,069,923
[45] Date of Patent: May 30, 2000

[54] METHOD AND A CIRCUIT ARRANGEMENT FOR THE PROCESSING OF RECEIVED SIGNALS IN A TELECOMMUNICATION SYSTEM

[75] Inventors: Kjell Östman, Salo; Tero Kuusinen, Turku, both of Finland

[73] Assignee: Nokia Mobile Phones Limited, Espoo, Finland

[21] Appl. No.: 09/016,031

[22] Filed: Jan. 30, 1998

[30] Foreign Application Priority Data

Jan. 31, 1997 [FI] Finland ..................................... 970437

[51] Int. Cl.[7] .............................. H03K 9/00; H04L 27/06; H04L 27/14; H04L 27/22
[52] U.S. Cl. ............................. 375/316; 375/377; 455/133
[58] Field of Search ...................................... 375/316, 377, 375/349, 267, 347, 350, 321, 332, 355, 270, 281; 455/313, 132–133, 134, 135

[56] References Cited

U.S. PATENT DOCUMENTS

| | | | |
|---|---|---|---|
| 5,291,474 | 3/1994 | Ikonen et al. | 370/30 |
| 5,301,367 | 4/1994 | Heinonen | 455/76 |
| 5,359,156 | 10/1994 | Chan et al. | 178/19 |
| 5,390,168 | 2/1995 | Vimpari | 370/30 |
| 5,471,652 | 11/1995 | Hulkko | 455/76 |
| 5,519,885 | 5/1996 | Vaisanen | 455/76 |
| 5,630,218 | 5/1997 | Muto | 455/226.2 |

FOREIGN PATENT DOCUMENTS 0 631 400 A1  12/1994  European Pat. Off. .
WO 95/10889  4/1995  WIPO .

*Primary Examiner*—Chi H. Pham
*Assistant Examiner*—Jean B Corrielus
*Attorney, Agent, or Firm*—Perman & Green, LLP

[57] ABSTRACT

The object of the invention is a method and a circuit arrangement for the processing of a signal in connection with its reception, when the signal conforms to one or more system specifications. The invention is preferably applied in receivers operating on two frequency ranges or in receivers intended to be used in two radio communication systems. Preferably the receiver is a part of a mobile station or a base station of a cellular system. An inventive idea is that before the analog-to-digital converter (324) the intermediate frequency signal (IF1, IF2) is processed on a wide band (310, 320) so that both the narrow band signal and the broadband signal are on the pass-band of the signal line. Then, when a narrow band signal is received, the signal also contains signals outside the band of the payload signal. Then the analog-to-digital conversion (324) is performed on a conversion range with a sufficiently wide conversion dynamics, so that also the signals outside the band can be converter without causing distortion components on the received band. The bandwidth is eventually restricted by digital signal processing (326). In a receiver according to the invention it is not necessary to filter the signal depending on its bandwidth, so there is no need for intermediate frequency filters for each system.

11 Claims, 6 Drawing Sheets

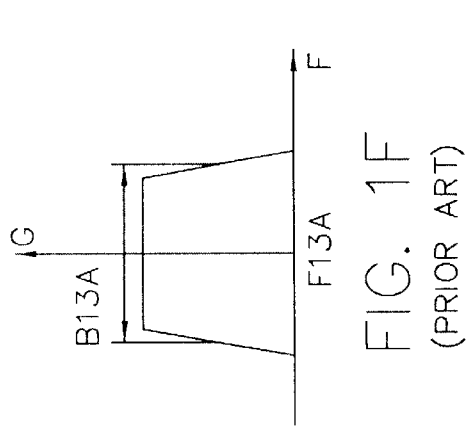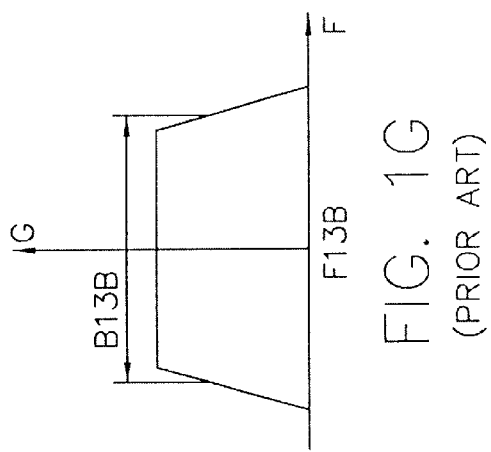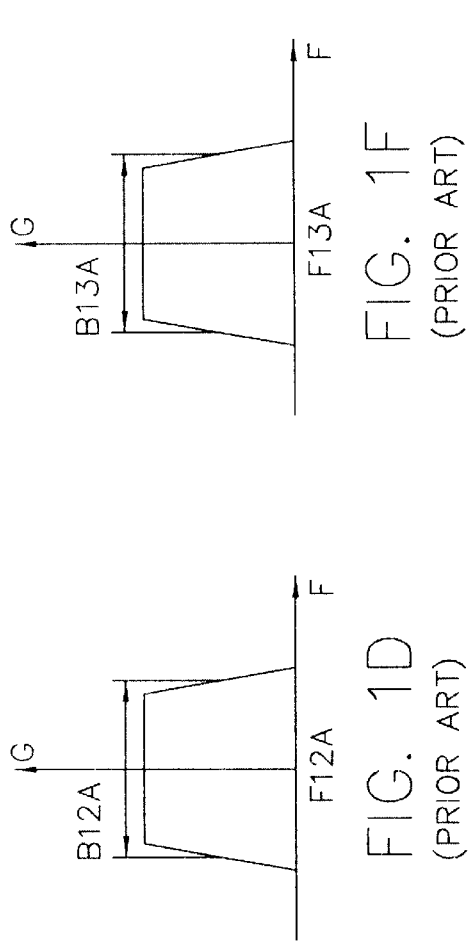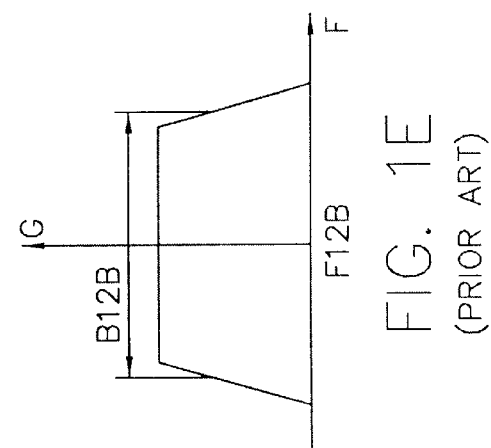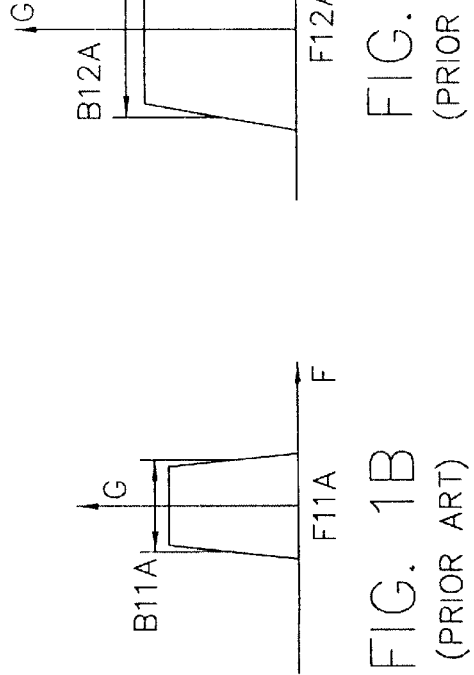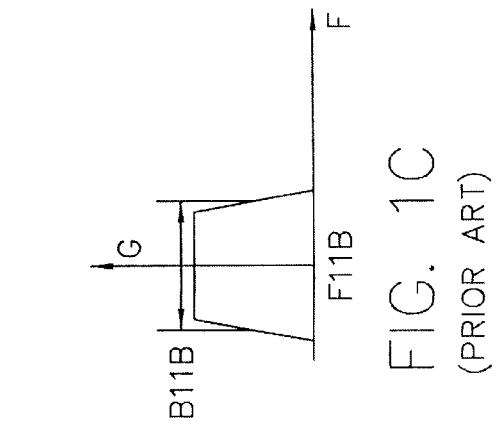

METHOD AND A CIRCUIT ARRANGEMENT FOR THE PROCESSING OF RECEIVED SIGNALS IN A TELECOMMUNICATION SYSTEM

BACKGROUND OF THE INVENTION

1. Field of the Invention

The present invention involves is a method and a circuit arrangement for the processing of a signal in connection with its reception, when the signal conforms to one or more system specifications. The invention is preferably applied in receivers operating on two frequency ranges or in receivers intended to be used in two radio communication systems. Preferably the receiver is a part of a mobile station or a base station of a cellular system.

2. Description of the Prior Art

Mobile communication systems develop and grow very fast, so that in many regions systems according to several different standards have been constructed or are under construction. Therefore there is now a need for such mobile stations and base stations which can be used in more than one system. For instance in the USA, Direct Sequence Spread Spectrum (DSSS) systems will be built in addition to the systems based on the frequency modulation (FM) technology now in use. Characteristics of receivers operating in these two system types are specified in the standard IS-95.

There are further in development so called third generation systems, which probably will require a dual-mode operation of the receiver. Of these systems we could mention the Universal Mobile Telecommunications System (UMTS) defined by the European Telecommunications Standards Institute (ETSI), and the Future Public Land Mobile Telecommunications Systems (FPLMTS) defined by the radio suction of the International Telecommunication Union.

A receiver operating in two systems must be able to process signals conforming to two different specifications. The signals of these systems may have different bit rates, signal bandwidths, and channel rasters. Channel raster means the frequency difference between two adjacent channels. For instance in the GSM system the signal bit rate is 270.833 kbit/s, the channel raster is 200 kHz, and the signal bandwidth is 200 kHz. On the other hand, for instance in the DECT system the bit rate is 1.152 Mbit/s, the channel raster is 1728 kHz and the signal bandwidth is about 1 MHz. In future systems, such as in e.g. the UMTS system, the bandwidth required for the transmission of a signal will probably be wider than in the GSM and DECT systems, due to the higher bit rate.

FIG. 1a shows a previously known circuit arrangement 100 for the reception of signals of two systems. The radio frequency (RF) signal Rx received via the antenna 101 is supplied into two receive branches A and B. The signal according to the system specification A is filtered in the band-pass filter 102a, amplified 104a and mixed to the intermediate frequency by the signal obtained from the oscillator 108a, so that the output of the mixer 106a provides the intermediate frequency signal IF1. The intermediate frequency signal is further supplied to the band-pass filter 110a, and the signal obtained from this is amplified 112a. Then this signal is mixed by a signal obtained from a second oscillator 116a, whereby the output of the mixer 114a provides a second intermediate frequency signal IF2. The second intermediate frequency signal is band-pass filtered 118a and amplified 120a.

Correspondingly, a signal according to the second system specification B is processed in the second signal branch B, which comprises units corresponding to those of the signal branch A: a band-pass filter 102b, an amplifier 104b, and a mixer 106b with an accompanying oscillator 108b, and a band-pass filter 110b, an amplifier 112b, and a mixer 114b with an accompanying oscillator 116b, and a band-pass filter 118b and an amplifier 120b.

Due to the band-pass filters the signal according to the system specification A is prevented to propagate in the signal branch B, and the signal according to the system specification B is prevented to propagate in the signal branch A. The signal branch can be selected with a switch (not shown in FIG. 1) if the systems A and B use the same RF frequency band.

The switch 122 selects either the signal from the signal branch A or the signal from the signal branch B to be supplied to the input of the analog-to-digital converter 124. In the analog-to-digital converter 124 the signal is sampled into digital samples by a sampling frequency determined by the sampling signal $f_s$. The signal converted into digital samples is further supplied to the digital signal processing unit 126, which performs signal detection and provides a digital baseband output signal, which further can be converted into an analog signal by a digital-to-analog converter (not shown in FIG. 1a).

For instance, in a mobile communications network the signal selected for the analog-to-digital converter can be controlled in accordance with a change-over instruction transmitted by the mobile network. Then the signal processing unit detects this instruction and controls the switch 122 in the manner indicated by the instruction. If the mobile system permits the user of a mobile station to select the system he uses, then the processor of the mobile station generates a control instruction to the switch, based on an instruction given by the user via the a interface, such as a keyboard. FIG. 1b shows the pass-band of the band-pass filter 102a, which is dimensioned according to the frequency range used in the system A. The filter 102a has a pass-band width B11a and a center frequency F11a. Correspondingly, FIG. 1c shows the pass-band of the band-pass filter 102b, which is dimensioned according to the frequency range used in the system B. The filter 102b has a pass-band width B11b and a center frequency F11b.

FIG. 1d shows the pass-band of the first intermediate frequency band-pass filter 110a in the signal branch A. The width of this pass-band is B12a and the center frequency F12a. Correspondingly, FIG. 1e shows the pass-band of the first intermediate frequency band-pass filter 110b in the signal branch B. The width of this pass-band is B12b and the center frequency F12b. Further, the FIG. 1f shows the pass-band of the second intermediate frequency band-pass filter 118a in the signal branch A, having a pass-band width B13a and the center frequency F13a. Correspondingly, the FIG. 1g shows the pass-band of the second intermediate frequency band-pass filter 118b in the signal branch B, having a pass-band width B13b and the center frequency F13b. FIGS. 1d, 1e, 1f and 1g show that the pass-bands of the intermediate frequency band-pass filters are narrower in the signal branch A and wider in the signal branch B, according to the specifications of the systems A and B.

The most significant disadvantage of the prior art presented above is that it requires the use of separate intermediate frequency band-pass filters for each system. These filters must have a high attenuation outside the signal band, and therefore they are large-sized and expensive components. Due to the two intermediate frequency signal branches also the number of mixer and amplifier components is high. Alternatively the mixer and amplifier components can also be used for both signals, but this requires a substantially high number of controllable switches, with which the signal is connected to the intermediate frequency filters according to the respective system.

OBJECT OF THE INVENTION

The object of the invention is to create a simple solution for receiving the signals of different systems, when the received signals have different signal bandwidths.

SUMMARY OF THE INVENTION

One idea of the invention is that before the analog-to-digital conversion the intermediate frequency signal is processed as a broadband signal in the same intermediate frequency signal line, so that the signals having different intermediate frequency bandwidths are within the pass-band of the signal line. When a narrow band signal is received the signal also contains other intermediate frequency signals than the received payload signal. Then the analog-to-digital conversion is made on a conversion range with a wide dynamics, so that also out-band signals can be converted without causing distortion components on the band of the received payload signal. The final bandwidth restriction is then performed by digital signal processing.

In the solution according to the invention the intermediate frequency signals have substantially the same center frequency, and they pass through the IF section at different times, except for signals of the CDMA system which can be separated.

Several advantages are obtained with the invention. It is not necessary to filter the intermediate frequency signal depending on the signal bandwidth, and therefore separately intermediate frequency filters are not required for each system. It is also possible to minimize the number of mixers, amplifiers and signal switches. Further it is possible to have a narrower dynamic operating range of the automatic gain control circuit or the AGC circuit, or the circuit could be omitted altogether. Thus a remarkably small-sized receiver is obtained, and savings are obtained in the manufacturing costs compared to prior art solutions. Further the receiver of the invention can also be used to receive signals of new systems, without changes in the intermediate frequency section.

The method according to the invention for processing a received signal, in which
an RF signal appearing in a predetermined frequency range is received,
the received signal is converted into an intermediate frequency signal,
said signal in the neighborhood of the intermediate frequency is converted into a digital sampled signal, and
the digital sampled signal is digitally processed,
is characterized in that before said conversion into a digital sampled signal said intermediate frequency signal is processed on a pass-band, which is substantially wider than the bandwidth of the received signal.

The circuit arrangement according to the invention, comprising
means to receive an RF signal appearing in a predetermined frequency range,
mixer means to convert the received signal into an intermediate frequency signal,
an analog-to-digital converter to convert said intermediate frequency signal into a digital sampled signal, and
signal processing means to process the digital sampled signal,
is characterized in that the pass-band of the intermediate frequency signal line before the analog-to-digital conversion is arranged to be substantially wider than the bandwidth of said signal.

Advantageous embodiments of the invention are presented in the dependent claims.

BRIEF DESCRIPTION OF THE DRAWINGS

The invention is described in more detail below with reference to the enclosed drawings, in which FIG. 1b, 1c, 1d, 1e, 1f and 1g show the pass-bands of the filters in the receiver according to FIG. 1a, FIG. 2a shows a block diagram of a combined telephone's receiver according to the invention operating in two different communication systems, FIGS. 3a, 3b, 3c, 3d and 3e show the pass-bands of the filters in the receiver according to FIG. 3a.

DETAILED DESCRIPTION OF THE PREFERRED EMBODIMENT(S)

FIGS. 1a, 1b, 1c, 1d, 1e, 1f and 1g were already described above in connection with the description of prior art.

Figure 1A:
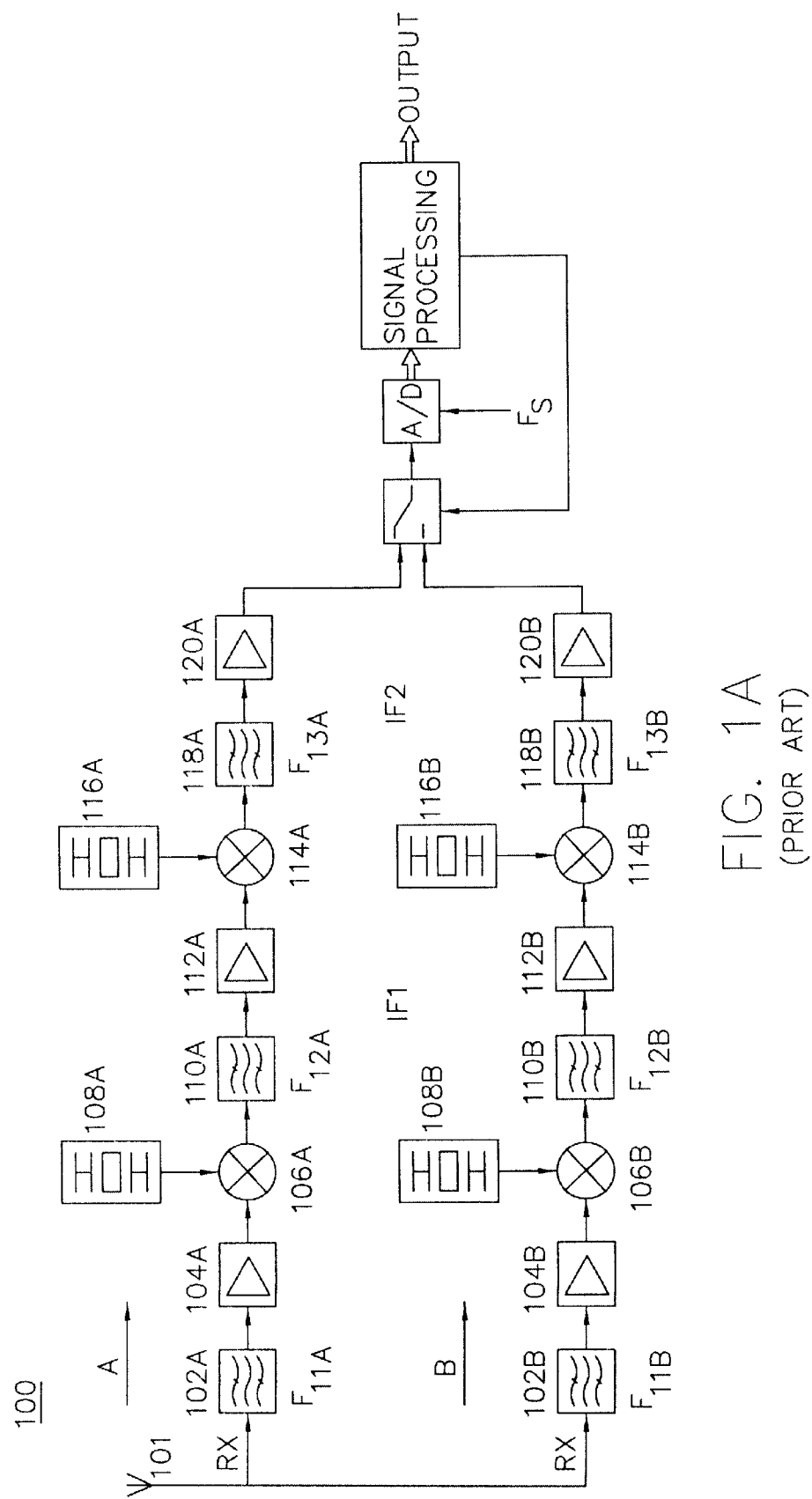
FIG. 1a shows a block diagram of a prior art combined telephone's receiver operating in two different communication systems.
Figure 2A:
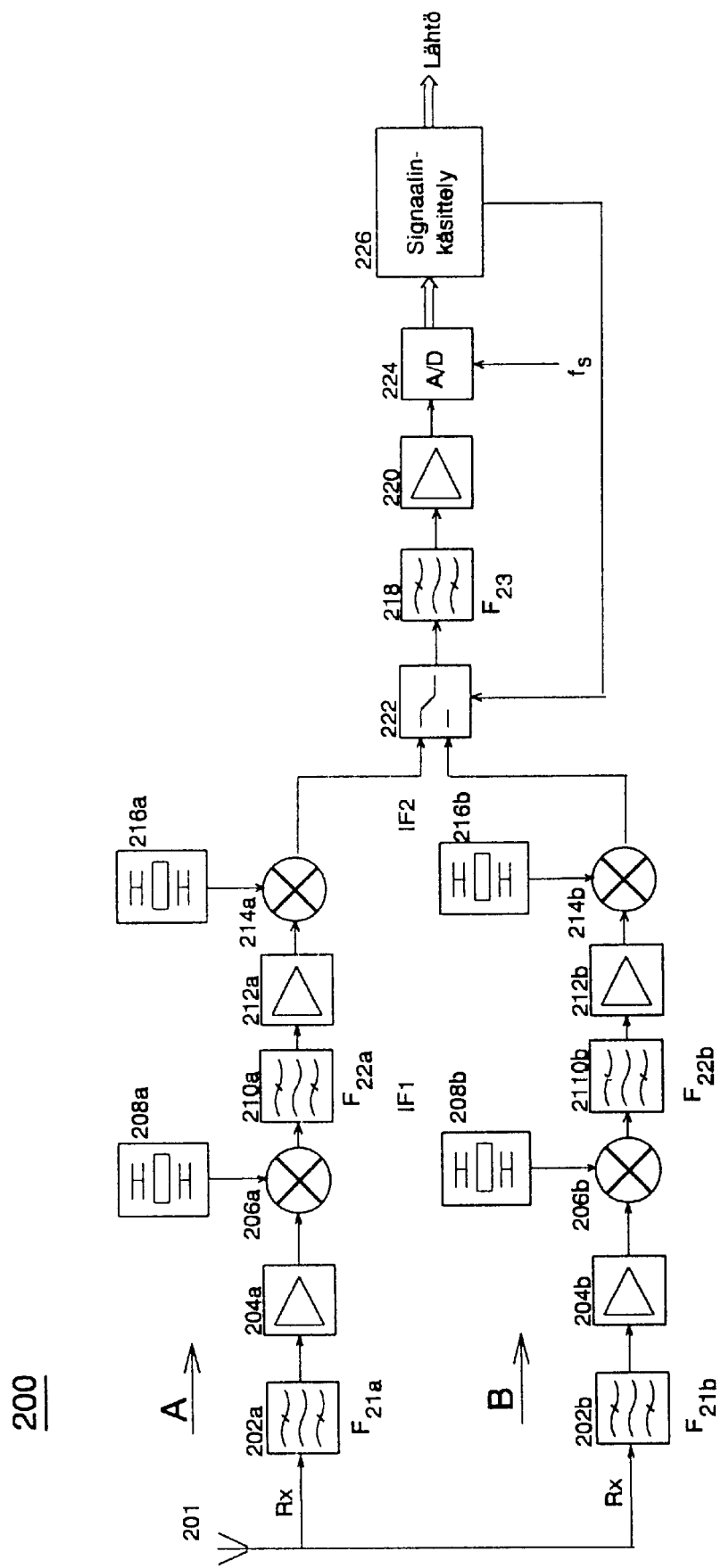
FIGS. 2b, 2c, 2d, 2e and 2f show the pass-bands of the filters in the receiver according to FIG. 2a, FIG. 3a shows a block diagram of a combined telephone's receiver according to the invention operating in the DCS and the DECT systems.
Figure 2F:
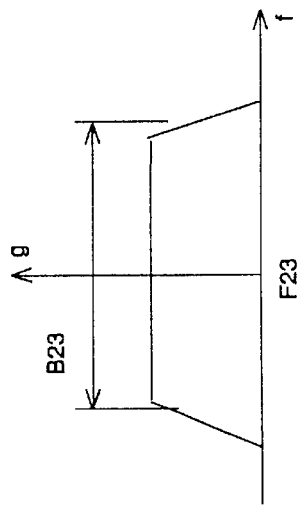

FIG. 2a shows a block diagram 200 of the receiver in a combined telephone according to the invention, operating in two different communication systems. There the RF signal Rx received via the antenna 201 is supplied to two reception branches A and B. A signal according to the system A specification is filtered in the bandpass filter 202a, amplified 204a and mixed to the intermediate frequency by the signal obtained from the oscillator 208a, so that the output of the mixer 206a provides an intermediate frequency signal IF1. The intermediate frequency signal is further supplied to the band-pass filter 210a, and the signal obtained from the filter is amplified 212a. Then the signal is mixed by a signal obtained from a second oscillator 216a, whereby the output of the mixer 214a provides a second intermediate frequency signal IF2.

Correspondingly, a signal according to the system B specification is processed in the second signal branch B, comprising units corresponding to those of the signal branch A: a band-pass filter 202b, an amplifier 204b and a mixer 206b with an accompanying oscillator 208b, and a band-pass filter 210b, an amplifier 212b, and a mixer 214b with an accompanying oscillator 216b.

Due to the band-pass filters the signal according to the system A specifications is prevented to pass through the signal branch B, and the signal according to the system B specifications is prevented to pass through the signal branch A. The switch 222 further selects for processing either the signal of the signal branch A or the signal of the signal branch B.

The signal selected by the switch 222 is supplied to a band-pass filter, which according to the invention has a sufficiently wide pass-band, so that both the signal of the system A and the signal of the system B are within the pass-band of the filter. Then the signal is amplified 220 and supplied to the analog-to-digital converter 224, where the signal is sampled into digital samples by a sampling frequency determined by the sampling signal f.

The signal converted into digital samples is further supplied to the digital signal processing unit 226, in which the signal is digitally band-pass filtered according to the invention. The unit 226 also performs signal detection, and it provides a digital baseband output signal, which further can be converted into an analog signal by a digital-to-analog converter (not shown in FIG. 2a). The switch 222 is controlled in a corresponding manner as in the solution according to figure 1a.

Figure 2D:
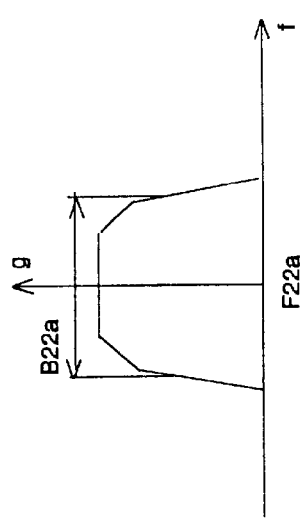
Figure 2E:
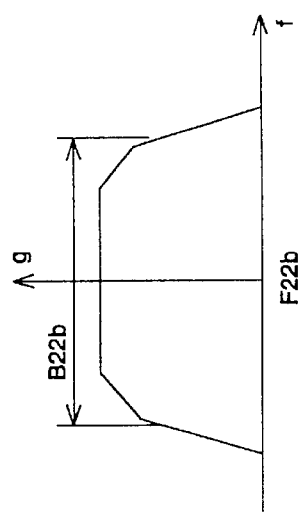
Figure 2B:
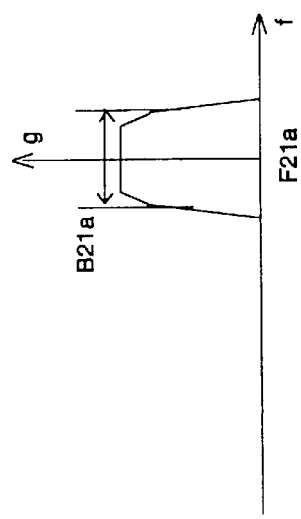
Figure 2C:
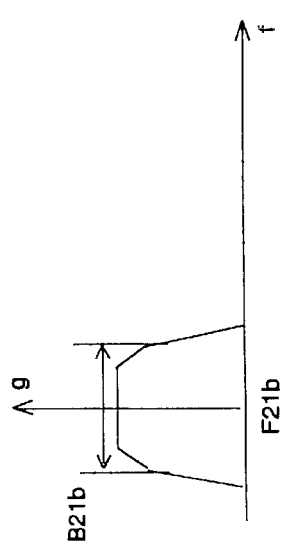

FIG. 2b shows the pass-band of the band-pass filter 202a, which is dimensioned according to the frequency range used in the system A. The width of the pass-band of the filter 202a is B21a and its center frequency is F21a. Correspondingly, FIG. 2c shows the pass-band of the band-pass filter 202b in the signal branch B, which is dimensioned according to the frequency range used in the system B. The pass-band width of the filter 202b is B21b and its center frequency is F21b.

FIG. 2d shows the pass-band of the first intermediate frequency band-pass filter 210a in the signal branch A. The width of this pass-band is B22a and the center frequency is F22a. Correspondingly, FIG. 2e shows the pass-band of the first intermediate frequency band-pass filter 210b in the signal branch B. The width of this pass-band is B22b and the center frequency is F22b. The pass-bands of the above mentioned band-pass filters correspond to the pass-bands shown in FIGS. 1b, 1c, 1d and 1e.

Further the figure of shows the pass-band of the second intermediate frequency band-pass filter 218 having the width B23 and the center frequency F23. According to the invention the pass-band of the second intermediate frequency band-pass filter 218 is so wide that the signals of both system A and system B are within the passband. Because the final bandwidth restriction is performed in the digital signal processing unit, the arrangement according to the invention can use only one second intermediate frequency band-pass filter, or this filter could be omitted altogether.

Figure 3A:
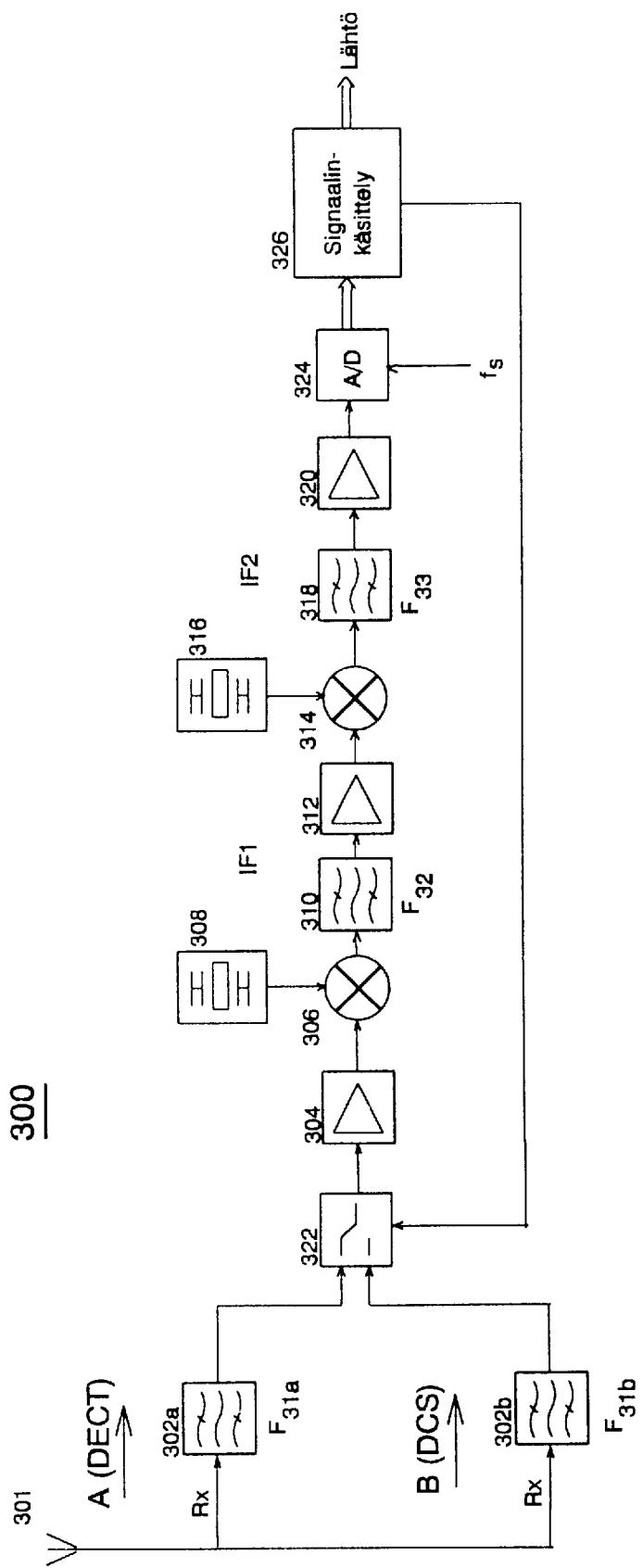

FIG. 3a shows a block diagram of the receiver of a combination telephone according to the invention operating in the DECT and DCS systems. Below is first a description of the DECT and DCS system characteristics, and the application of the invention in said systems. Then there is a more detailed description of the circuit arrangement shown in figure 1a.

The DCS system utilizes the GMSK modulation of the GSM system in which the signal bandwidth is about 200 kHz. The width of the received frequency range covering all channels is 75 MHz. In the DCS system the bit rate is 270.833 bit/s. The DECT system utilizes a non-linear GFSK modulation, in which the signal bandwidth is theoretically infinite, but in practice the bandwidth is about 1 MHz. In the DECT system the reception bandwidth is 20 MHz and the bit rate is 1.152 Mbit/s, as mentioned in the prior art description above.

The signals of these systems having quite different operating principles can be received with one a single receiver according to the invention, where only the RF front-end sections are system dependent, due to the different signaling frequencies of the systems and their different RF signal tolerance requirements. When the first intermediate frequency has been generated the arrangement uses the same receiver structure for the processing of both signals, because the DCS system's reception bandwidth of 75 MHz can be filtered to 20 MHz, which is the reception bandwidth of the DECT system. Thus both signals are supplied along the same signal line to the second mixer, which generates the second intermediate frequency. The second intermediate frequency is a broadband signal; its pass-band is at least 1 MHz. Then there is no filtering of the signals of the DCS system nor of the DECT system, and the signals will propagate without distortion to the analog-to-digital converter. After the conversion there is a digital band-pass filtering, where the filtering characteristics are determined in software so that they correspond to the respective received signal's characteristics. Thus the receiver operates optimally both in the DECT system and in the DCS system.

In the circuit arrangement according to FIG. 3a the RF signal Rx received via the antenna 301 is supplied to two band-pass filters 302a and 302b, whereby the signal according to the DECT system specification A is filtered in the band-pass filter 302a and the signal according to the DCS system specification B is filtered in the band-pass filter 302b. Then the switch 322 selects for further processing either the filtered signal of the A branch, or the filtered signal of the B branch.

The signal selected by the switch 322 is amplified 304 and mixed to the intermediate frequency by the signal obtained from the oscillator 308 so that the output of the mixer 306 provides the intermediate frequency signal IF1. The intermediate frequency signal is further supplied to the band-pass filter 310, and the signal obtained from the filter is amplified 312. Then the signal is mixed by a signal obtained from the second oscillator 316, whereby the output of the mixer provides the second intermediate frequency signal IF2. The second intermediate frequency signal is supplied to the band-pass filter 318 and then the signal is amplified 320 and supplied to the analog-to-digital converter 324, in which the signal is sampled into digital samples by a sampling frequency determined by the sampling signal $f_s$. The signal converted into digital samples is further supplied to the digital signal processing unit 326, which according to the invention performs the digital band-pass filtering of the signal. The unit 326 also performs signal detection, and this produces a digital baseband output signal, which further can be converted into an analog signal by a digital-to-analog converter (not shown in FIG. 3a). The switch 222 is controlled in a corresponding manner as in the solution according to figure 1a.

Figure 3E:
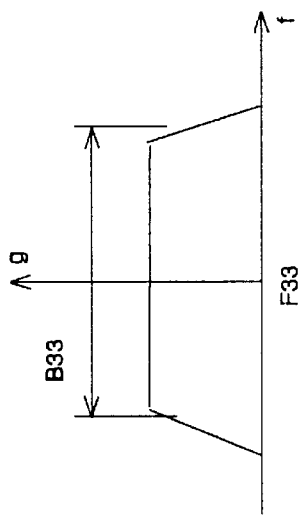
Figure 3D:
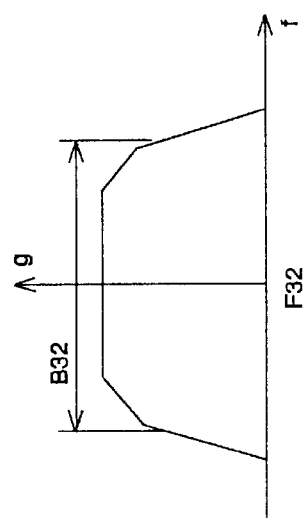
Figure 3B:
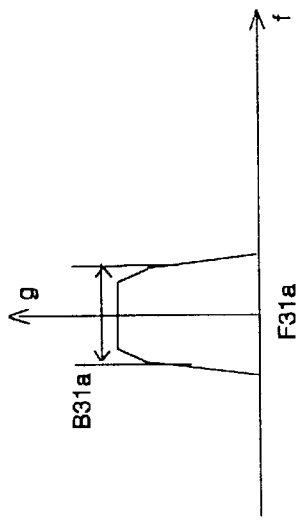
Figure 3C:
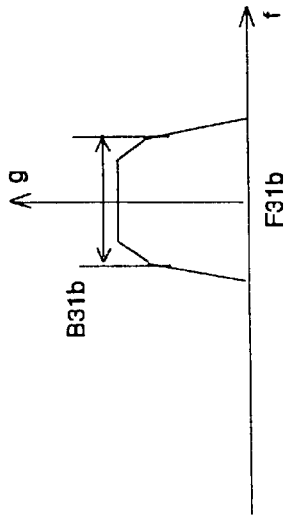

FIG. 3b shows the pass-band of the band-pass filter 302a, which is dimensioned according to the frequency range used in the DECT system (A). The width B31a of the pass-band of the filter 302a is then 20 MHz and the center frequency F31a is 1906 MHz. Correspondingly, FIG. 3c shows the pass-band of the band-pass filter 302b in the signal branch B, which is dimensioned according to the frequency range used in the DCS system (B). The pass-band width B31b of the filter 302b is then 85 MHz and the center frequency F31b is 1848 MHz.

FIG. 3d shows the pass-band of the first intermediate frequency band-pass filter 310a. The width of this pass-band B32a is 20 MHz and the center frequency is F32a. Further, FIG. 3e shows the pass-band of the second intermediate frequency band-pass filter 318 with the center frequency F33 and a pass-band B33 of 1.3 MHz. According to the invention the pass-bands of the first and the second intermediate frequency band-pass filters are so wide that the signals of both the DECT system and the DCS system are within the pass-band of the filters. Because the final bandwidth restriction is made in the digital signal processing unit, it is possible in the arrangement according to the invention to use a single band-pass filter for the first intermediate frequency signal and a single band-pass filter for the second intermediate frequency signal, or these filters can even be omitted altogether.

Preferably the circuit arrangement according to the invention utilizes an analog-to-digital converter operating on a dynamically wide conversion range. Then it is possible to convert a frequency range which is wider than the bandwidth of the payload signal, without causing distortion components in the signal's frequency band. The conversion dynamics of a typical wide bandwidth converter is about 80 to 90 dB. Then it is also possible to reduce the operating range of the automatic gain control circuit, or it can even be omitted altogether, as in the solutions shown in FIGS. 2a and 3a. An advantage of a solution of this kind is also the good linearity of the receiver.

The solutions according to the invention can be used in a mobile station of a system operating on two different frequency ranges, and in a mobile station operating on two different frequency ranges. The solution according to the invention can as well be used e.g. in a pager operating in two different paging systems, so the invention is not limited only to mobile stations.

While the invention was described above for processing a signal according to two system specifications, it is obvious that the invention is well applicable to the processing of a signal according to three or more specifications.

The realization of the above presented embodiments is not here shown on a detailed circuit design level, because the shown blocks can be realized with commonly available components in a manner known by a person skilled in the art.

Above were presented only some applications of the invention. The inventive principle could of course be modified within the scope of the claims, e.g. regarding the details and the application areas of the embodiment.

Particularly, the communication systems and the frequency bands relating to them were described only as examples, and the application of the invention is in no way limited to the shown communication systems and the shown signal bands. Particularly one can state, that the invention can be applied in all TDMA systems, such as in the GSM, DCS and DECT systems, and as well in the CDMA systems, such as in the IS-95 system. Further the invention can be used in planned future systems, such as in the UMTS system.

We claim:

1. A method for processing a received signal, in which an RF signal appearing in a predetermined frequency range is received, comprising the steps of:

converting the received RF signal into an intermediate frequency signal, processing said intermediate frequency signal by band-pass filtering on a pass-band with a width which is substantially wider than the bandwidth of the received signal, converting said intermediate frequency signal in the neighborhood of the intermediate frequency into a digital sampled signal, and digitally processing the digital sampled signal, and wherein said processing step further comprises the steps of:

processing a first received RF signal belonging to a first communication system and having a first signal bandwidth, processing a second received RF signal belonging to a second communication system and having a second signal bandwidth, which is substantially wider than said first received RF signal bandwidth, and when the first received RF signal is processed, performing the processing of said intermediate frequency signal before the signal conversion into digital sampled signal on a passband with a width that is at least as wide as said second received RF signal bandwidth.

2. A method according to claim 1, wherein said intermediate frequency signal conversion into a digital sampled signal is performed on a substantially wider dynamic range than the dynamics of the intermediate frequency signal on the signal band width.

3. A method according to claim 1, wherein the band-pass filtering of the received RF signal is substantially made by digital signal processing.

4. A method according to claim 1, wherein when the first received signal is processed, the band-pass filtering is performed by digital signal processing so that it substantially conforms to the bandwidth of the first received signal.

5. A method as in claim 1, wherein the RF signal is received with a receiver operable with one of a Global System Mobile (GSM), Digital Cross-connect System (DCS), Universal Mobile Telecommunications System (UMTS), or Future Public Land Mobile Telecommunications System (FPLMTS) system specification.

6. A method as in claim 1, wherein at least one RF received signal is digitally modulated.

7. A circuit arrangement for processing a received signal, the circuit arrangement comprising:

receiving means to receive an RF signal appearing in a predetermined frequency range, an intermediate frequency signal line, coupled to said receiving means for processing the received RF signal, the pass-band of said intermediate frequency signal line being arranged to be substantially wider than the bandwidth of said received RF signal, mixer means, coupled to said intermediate frequency signal line, to convert the received RF signal into an intermediate frequency signal, an analog-to-digital converter to convert said intermediate frequency signal into a digital sampled signal, and signal processing means to process the digital sampled signal, and wherein said receiving means receives a first signal according to a first communication system and a second signal according to a second communication system, whereby the first signal has a first signal bandwidth and the second signal has a second signal bandwidth which is substantially wider than said first signal bandwidth, and further comprising means to process the intermediate frequency signal, disposed before the analog-to-digital converter, by band-pass filtering on a pass-band with a width that is at least as wide as said second signal bandwidth.

8. A circuit arrangement according to claim 7, wherein said analog-to-digital converter is arranged to convert the intermediate frequency signal with a substantially wider dynamics than the dynamics of the intermediate frequency signal on the signal bandwidth.

9. A circuit arrangement according to claim 7, wherein the signal processing means comprise means for band-pass filtering the digital sampled signal so that it substantially conforms to the bandwidth of the digital sampled signal.

10. A circuit arrangement as in claim 7, wherein said circuit arrangement is employed in a receiver operable with one of a Global System Mobile (GSM), Digital Cellular System (DCS), Universal Mobile Telecommunications System (UMTS), or Future Public Land Mobile Telecommunications System (FPLMTS) system specification.

11. A circuit arrangement as in claim 7, wherein at least one RF received signal is digitally modulated.

* * * * *